United States Patent [19]

Shikata et al.

[11] Patent Number: 5,750,243
[45] Date of Patent: May 12, 1998

[54] SURFACE ACOUSTIC WAVE DEVICE AND DIAMOND BASE MATERIAL FOR THE SAME

[75] Inventors: Shin-ichi Shikata; Hideaki Nakahata; Kenjiro Higaki; Satoshi Fujii; Akihiro Hachigo, all of Itami, Japan

[73] Assignee: Sumitomo Electric Industries, Ltd., Japan

[21] Appl. No.: 521,382

[22] Filed: Jun. 16, 1995

[30] Foreign Application Priority Data

Jun. 20, 1994 [JP] Japan .................. 6-137628

[51] Int. Cl.$^6$ .................................. H03H 9/145
[52] U.S. Cl. .................. 428/216; 428/408; 428/212
[58] Field of Search .................. 428/408, 216, 428/212

[56] References Cited

U.S. PATENT DOCUMENTS

| | | | |
|---|---|---|---|
| 5,006,203 | 4/1991 | Purdes | 423/446 |
| 5,082,522 | 1/1992 | Purdes et al. | 423/446 |
| 5,144,380 | 9/1992 | Kimoto et al. | 357/22 |
| 5,173,761 | 12/1992 | Dreifus et al. | 257/22 |
| 5,328,715 | 7/1994 | Iacovangelo et al. | |
| 5,371,383 | 12/1994 | Miyata et al. | 428/408 |
| 5,382,758 | 1/1995 | Iacovangelo et al. | |

OTHER PUBLICATIONS

Shikata et al., "Microfabrication Technique for Diamond Devices", 2ND International Conference on the Applications of Diamond Films and Related Materials (1993), pp. 377-380.

Patent Abstracts of Japan, vol. 13, No. 272, Jun. 22, 1989 and JP A 01 062911, Mar. 9, 1989.

*Primary Examiner*—Archene Turner
*Attorney, Agent, or Firm*—Pennie & Edmonds LLP

[57] ABSTRACT

A diamond base material for surface acoustic wave device, which includes: a low-resistivity base material, and a high-resistivity diamond layer having a thickness of 5–50 μm disposed on the low-resistivity base material.

4 Claims, 6 Drawing Sheets

ELECTRODE INTERSECTION WIDTH: w
ELECTRODE WIDTH: d

CONNECTION FOR IMAGE
(BASIC UNIT)

IMAGE REPETITION METHOD 5,750,243

SURFACE ACOUSTIC WAVE DEVICE AND DIAMOND BASE MATERIAL FOR THE SAME

BACKGROUND OF THE INVENTION

1. Field of the Invention

The present invention relates to a diamond base material which may suitably be used for fabricating a surface acoustic wave device (hereinafter, mainly referred to as "SAW device"), and a SAW device utilizing such a diamond base material.

2. Related Background Art

Diamond has a highest acoustic propagation velocity among all of the materials which are present on the earth, and has a band gap energy of 5.5 eV, which is very large as compared with those of known semiconductor substances. In addition, diamond is transparent with respect to light having a wavelength ranging from a near-ultraviolet region to a near-infrared region. Accordingly, it is expected that diamond can improve an operating characteristic and/or can widen an operating range or latitude in various technical or scientific fields such as acoustic, surface acoustic wave, optical, and semiconductor fields.

In addition, since diamond has a good thermal conductivity, not only diamond itself may desirably function as a heat sink material, but also a stable functional device or element (such as optical functional device) which requires substantially no temperature compensation for heat may be constituted by use of diamond.

By utilizing such dynamical, electric or electronic characteristics, diamond has been used for a wide variety of dynamical, optical, electric or electronic devices (as described in, e.g., "Diamond Thin Film", written by Tadao Inuzuka, pp. 99–115, 1990, published by Kyoritsu Shuppan (Tokyo, JAPAN)). Specific examples of such a device utilizing diamond may include a SAW device which may suitably be used for a high-frequency filter, etc.

Heretofore, as the above-mentioned SAW device, there is known one having a multilayered structure comprising a diamond thin film and a combination of an interdigital transducer or electrode having a comb-like shape (hereinafter, mainly referred to as "IDT") and a piezoelectric substance disposed on the diamond thin film, as disclosed in Japanese Patent Publication (KOKOKU) No. 38874/1979 (i.e., Sho 54-38874) and Japanese Laid-Open Patent Application (KOKAI) No. 62911/1989 (i.e., Sho 64-62911).

As described above, the SAW device has a structure comprising a diamond thin film and a piezoelectric layer disposed thereon, wherein the piezoelectric layer comprises a piezoelectric substance such as ZnO, quartz crystal, $LiNbO_3$ and $LiTaO_3$. Accordingly, the above-mentioned IDT constituting the SAW device is usually grounded by using a wire bonding method, i.e., a method wherein the IDT is grounded by use of a wire which is electrically connected to the IDT by way of a bonding pad.

However, the above-mentioned conventional wire bonding method has the following drawbacks.

(1) In the wire bonding method, it is necessary to provide, on a device to be wire-bonded, a sufficient space corresponding to the area of bonding pads to be used for the wire bonding, and therefore the size of the device itself necessarily becomes large to a considerable extent.

(2) In a case where the SAW device has a multi-electrode structure comprising a plurality of electrodes (inclusive of IDTs), the number of the bonding wires and the number of the bonding pads become considerably large, and therefore the size of the device itself becomes large to a further extent. In addition, the location or position of the bonding pads is considerably limited so that the bonding wires may be connected to the resultant bonding pads.

(3) In a case where the SAW device has a multi-electrode structure, the bonding steps themselves for conducting the wire bonding become complicated and troublesome.

Particularly, in recent years, there has strongly been demanded a small-sized SAW device of a surface-mounting type, i.e., a SAW device which may be mounted to a surface or surface portion of an apparatus wherein the SAW device is to be utilized. Accordingly, there has been desired the development of a grounding method which is suitably applicable to such a small-sized SAW device of the surface-mounting type.

SUMMARY OF THE INVENTION

An object of the present invention Is to provide a diamond base material or SAW device which has solved the above-mentioned problems encountered in the prior art.

Another object of the present invention is to provide a diamond base material or SAW device which may attain easy grounding of an electrode to be disposed on the diamond base material or to be disposed in the SAW device.

As a result of earnest study, the present inventors have found that it is very effective to use a low-resistivity member itself constituting a diamond/low-resistivity member structure, as a member for grounding connection.

The diamond base material according to the present invention is based on the above discovery and comprises: a low-resistivity base material, and a high-resistivity diamond layer having a thickness of 5–50 μm disposed on the low-resistivity base material.

The present invention also provides a diamond base material for surface acoustic wave device, comprising: a base material, a low-resistivity diamond layer having a thickness of 0.3–10 μm disposed on the base material, and a high-resistivity diamond layer having a thickness of 5–50 μm disposed on the low-resistivity diamond layer.

The present invention further provides a surface acoustic wave device, comprising:

a low-resistivity base material;

a diamond layer disposed on the low-resistivity base material, the diamond layer having a through hole formed therein;

a piezoelectric substance laver disposed on the diamond layer; and an interdigital transducer disposed in contact with the piezoelectric substance layer, the interdigital transducer being connected to the low-resistivity base material for grounding by way of the through hole formed in the diamond layer.

The present invention further provides a surface acoustic wave device, comprising:

a base material;

a low-resistivity diamond layer disposed on the base material;

a high-resistivity diamond layer disposed on the low-resistivity diamond layer, the high-resistivity diamond layer having a through hole formed therein;

a piezoelectric substance layer disposed on the high-resistivity diamond layer; and an interdigital transducer disposed in contact with the piezoelectric substance layer, the interdigital transducer being connected to the low-resistivity diamond layer and/or base material for grounding by way of the through hole formed in the high-resistivity diamond layer.

The present invention further provides a process for producing a surface acoustic wave device comprising: a low-resistivity base material; a diamond layer disposed on the low-resistivity base material, the diamond layer having a through hole formed therein; a piezoelectric substance layer disposed on the diamond layer; and an interdigital transducer disposed in contact with the piezoelectric substance layer, the interdigital transducer being connected to the low-resistivity base material for grounding by way of the through hole formed in the diamond layer;

wherein the through hole is formed by use of a dry etching method.

The present invention further provides a process for producing a surface acoustic wave device, comprising: a base material; a low-resistivity diamond layer disposed on the base material; a high-resistivity diamond layer disposed on the low-resistivity diamond layer, the high-resistivity diamond layer having a through hole formed therein; a piezoelectric substance layer disposed on the high-resistivity diamond layer; and an interdigital transducer disposed in contact with the piezoelectric substance layer, the interdigital transducer being connected to the low-resistivity diamond layer and/or base material for grounding by way of the through hole formed in the high-resistivity diamond layer;

wherein the through hole is formed by use of a dry etching method.

In the present invention, the above-mentioned IDT may be connected to either one of or both of the low-resistivity base material (or substrate) and the low-resistivity diamond layer, for the purpose of grounding.

According to the present invention, it is possible to extend the latitude or degree of freedom in the electrode connection or electric wiring to be utilized in a diamond base material having a structure of high-resistivity diamond/low-resistivity portion. As a result, it is possible to remarkably extend the latitude or freedom in the design or plan, in a case where various kinds of devices are constituted by use of the above-mentioned diamond base material. For example, in the present invention, the bonding pad to be used for wire bonding at the time of the actual SAW device mounting or packaging is omissible, and therefore the size of the SAW device itself may be reduced. In addition, in the present invention, since the condition or requirement for the selection of grounding position or location may relaxed or relieved, the latitude or degree of freedom in the device design may be extended. From such a viewpoint, the present invention may also contribute to the reduction in the device size.

Particularly, in a case where a SAW device having a multi-electrode structure is to be constituted, the effect of reducing the device size becomes considerably marked.

Furthermore, since the bonding pad For grounding is omissible in the present invention, at the time of the device mounting, the number of the wire bonding steps may be minimized so as to wire-bond a small number of lines for minimum requirement (e.g., it may be sufficient to conduct the wire bonding step only for a signal line for minimum requirement). As a result, the wire bonding steps per se may also be simplified.

Accordingly, the present invention may remarkably facilitate the fabrication or manufacturing of a small-sized device of a surface-mounting type, on the basis of a feature, or a combination of features as described above.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF PREFERRED EMBODIMENTS

Figure 1:
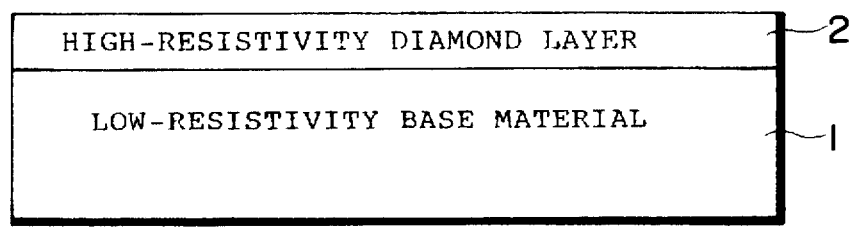
FIG. 1 is a schematic cross-sectional view showing an embodiment of the diamond base material according to the present Invention.

Hereinbelow, the present invention will be described in detail with reference to the accompanying drawings, as desired.

(Base material)

In the present invention, as a base material (or substrate), diamond and/or another material (such as silicon) may be used without particular limitation, as long as such a base material may provide a surface on which a high-resistivity diamond layer or a low-resistivity diamond layer may be disposed.

In a case where the above base material is a low-resistivity base material, the volume resistivity thereof may preferably be $10^3$ Ω·cm or lower.

(Diamond)

When the diamond constituting the base material or SAW device according to the present invention comprises a diamond layer (or diamond film), the method or process for growing the diamond layer is not particularly limited. More specifically, the growth process to be used in the present invention may be selected from known processes without particular limitation. Specific examples of such known processes may include: a CVD (Chemical Vapor Deposition) method, a microwave plasma CVD method, a PVD (Physical Vapor Deposition) method, a sputtering method, an ion plating method, a plasma jet method, a flame method, a hot filament method, etc.

In a case where the above diamond layer is a low-resistivity diamond layer, the volume resistivity thereof may preferably be $10^3$ $\Omega$·cm or lower. On the other hand, in a case where the above diamond layer is a high-resistivity diamond layer, the volume resistivity thereof may preferably be $10^6$ $\Omega$·cm or higher.

The above high-resistivity diamond layer may preferably have a thickness in the range of 5–50 μm. On the other hand, the above low-resistivity diamond layer may preferably have a thickness in the range of 0.3–10 μm.

The ratio between the volume resistivities of the above-described high-resistivity diamond layer and low-resistivity diamond layer (or low-resistivity base material) may preferably be not less than $10^3$, more preferably, not less than $10^5$ (particularly preferably, not less than $10^6$) in view of retention of a good balance between insulating property and conductivity.

In a case where the diamond base material according to the present invention having the above-described layered structure is used for a base material for a SAW device, the surface of a diamond layer (e.g., a high-resistivity diamond layer) on which an electrode comprising the SAW device (such as IDT and short-circuiting electrode) is to be disposed, may preferably have a surface roughness of 300 angstrom or smaller (more preferably, 150 angstrom or smaller) in terms of average roughness ($R_a$) measured by a probe method (i.e., a method using a needle as a probe or tracer) according to Japanese Industrial Standard (JIS) B 0601-1970. With respect to the details of the average roughness $R_a$, a book entitled "KIKAI KEISOKU (Mechanical Metrology)", 77–80 pages, 1974, written by Osamu Taniguchi, published by Yokendo K. K. (Tokyo, JAPAN) may be referred to.

(Embodiments of layer structure)

Figure 2:
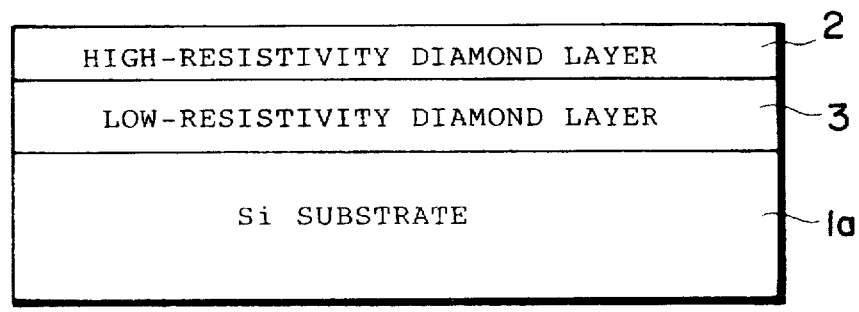
FIG. 2 is a schematic cross-sectional view showing another embodiment of the diamond base material according to the present invention.

Preferred examples of the Layer structure to be used in the present invention are shown in schematic cross-sectional views of FIGS. 1 and 2. In the embodiment as shown in FIG. 1, a high-resistivity diamond layer 2 is disposed on a low-resistivity silicon (Si) substrate. On the other hand, in the embodiment as shown in FIG. 2, a low-resistivity diamond layer 3 is disposed on a silicon substrate 1a, and further a high-resistivity diamond layer 2 is disposed on the above low-resistivity diamond layer 3. In a case where Si is used as a base material or substrate, it becomes easy to form a diamond base material (or a SAW device utilizing the base material) on the same substrate on which another device is to be disposed.

(SAW device)

In the present invention, a SAW device comprises: a low-resistivity member (such as low-resistivity substrate and low resistivity diamond layer), a diamond layer disposed on the low-resistivity member, a piezoelectric substance layer disposed on the diamond layer, and an IDT disposed in contact with the piezoelectric substance layer. In this SAW device, the above-described IDT is connected to the low-resistivity member (either one or both of the low-resistivity base material and the low-resistivity diamond layer) by way of (or via) a through hole for the purpose of grounding.

(Through hole)

In a case where a SAW device is constituted by using a diamond base material according to the present invention having the above-described layer structure, a through hole is formed in the above diamond layer (e.g., the high-resistivity diamond layer). The shape (planer shape, sectional shape, three-dimensional shape, etc.) and/or the size of the through hole is not particularly limited, as long as an electrical connection may be attained by way of (or via) such a through hole between an electrode (such as IDT and short-circuiting electrode) constituting a SAW device, and a low-resistivity member (such as low-resistivity diamond layer and low-resistivity base material) to be disposed under the high-resistivity diamond layer.

Specific examples of the method for forming such a hole in diamond may include two methods, i.e., a method using laser such as YAG laser and excimer laser, and a method using dry etching. The above-mentioned through hole may preferably be formed by use of a dry etching method in view of the controllability, the size of a through hole to be formed, the processability of a through hole for finishing thereof, etc. As such a dry etching method, any one or combination selected from known dry etching methods such as gas etching, plasma etching, reactive ion etching (RIE), and ion milling may be used without particular limitation. Among these, RIE may preferably be used in view of the selectivity of a material to be etched, and/or etching anisotropy.

(Embodiments of SAW device)

Figure 3:
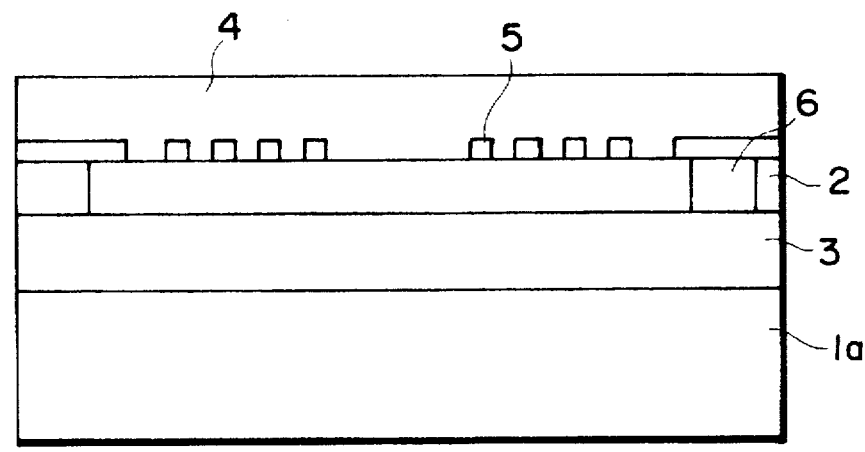
FIG. 3 is a schematic cross-sectional view showing an embodiment of the layer structure of a SAW device according to the present invention.

FIG. 3 shows a schematic cross-sectional view of an embodiment of the SAW device according to the present invention.

Referring to FIG. 3, in this embodiment, the SAW device comprises: a base material 1a, a low-resistivity diamond layer 3 disposed on the base material 1a, a high-resistivity diamond layer 2 disposed on the low-resistivity diamond layer 3, a piezoelectric substance layer 4 disposed on the high-resistivity diamond layer 2, and an IDT 5 disposed in contact with the piezoelectric substance layer 4. In the high-resistivity diamond layer 2, a through hole 6 is formed so as to allow electric connection between the IDT 5 and the low-resistivity diamond layer 3.

Figure 9:
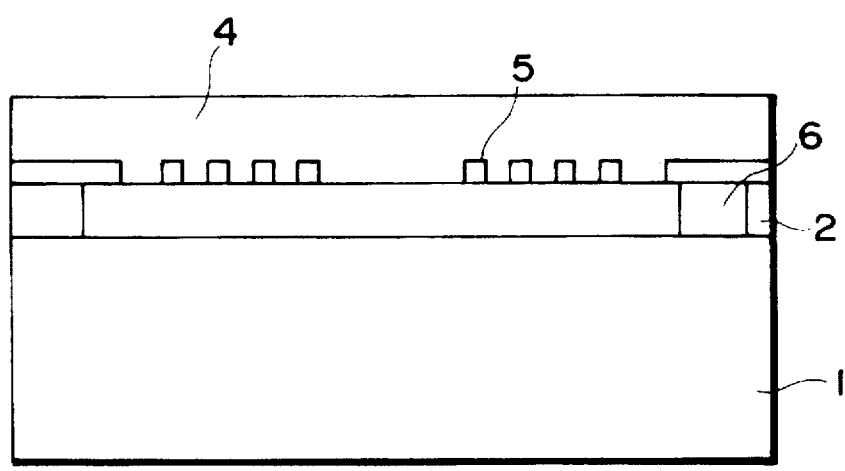
FIG. 9 is a schematic cross-sectional view showing another embodiment of the layer structure of a SAW device according to the present invention.

FIG. 9 shows another embodiment of the SAW device according to the present invention. Referring to FIG. 9, in this embodiment, the SAW device comprises: a low-resistivity base material 1, a high-resistivity diamond layer 2 disposed on the low-resistivity base material 1, a piezoelectric substance layer 4 disposed on the high-resistivity diamond layer 2, and an IDT 5 disposed in contact with the piezoelectric substance layer 4. In the high-resistivity diamond layer 2, a through hole 6 is formed so as to allow electric connection between the IDT 5 and the low-resistivity base material 1.

As described above, when an electrode is grounded via a through hole 6, the freedom or latitude in the device design may be widened. In addition, in such a case, it becomes possible to further miniaturize a device ,e.g., by decreasing the number of wires to be used for wire bonding. The member or place to be connected with such an electrode for the purpose of grounding may be either one or both of the above-described low-resistivity base material 1 and low-resistivity diamond layer 3.

In the embodiment as described above with respect to FIG. 3 (or FIG. 9), the IDT 5 is disposed under the lower surface of the piezoelectric substance layer 4 (i.e., between the piezoelectric substance layer 4 and the high-resistivity diamond layer 2). However, the IDT 5 may be disposed in another position (e.g., on the upper surface of the piezoelectric substance layer 4), as long as the IDT 5 is disposed in contact with the piezoelectric substance layer 4.

(Piezoelectric substance layer)

In the SAW device according to the present invention, the piezoelectric substance constituting the piezoelectric substance layer 4 may comprise any of known piezoelectric substances such as ZnO, quartz, LiNbO$_3$, and LiTaO$_3$ without particular limitation. The thickness of the piezoelectric substance layer may be appropriately selected in accordance with the kind of the piezoelectric substance to be used and/or the characteristic of a SAW device to be fabricated, etc.

The method for forming a film or layer of the above-mentioned piezoelectric substance is not particularly limited. More specifically, such a film forming method may be any one or combination selected from known methods such as CVD (Chemical vapor deposition) method, microwave plasma CVD method, PVD (Physical vapor deposition) method, sputtering method, and ion plating method without particular limitation. In view of the uniformity, mass productivity and piezoelectric property of the resultant film or layer, a sputtering method (particularly, an RF (radio frequency) magnetron sputtering method) may particularly preferably be used. (IDT)

The material constituting an IDT to be used in the present invention is not particularly limited, as long as it is an electrically conductive material. In view of the conversion to bulk wave, Al (aluminum) may particularly preferably be used for the above material for IDT.

The thickness of the IDT is not particularly limited, as long as it may function as such an electrode. The IDT may preferably have a thickness in the range of about 100–3000 angstrom (more preferably, about 300–1500 angstrom).

Figure 4:
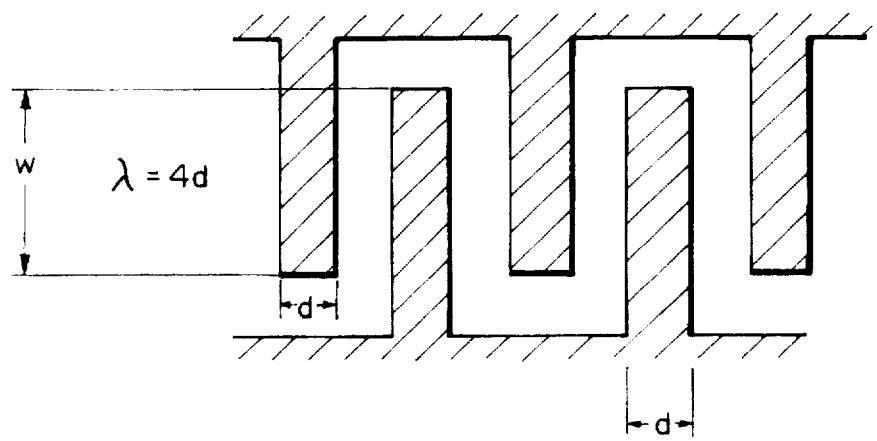
FIG. 4 is a schematic plan view showing an embodiment of the structure of an IDT which is usable in the SAW device according to the present invention.
Figure 5:
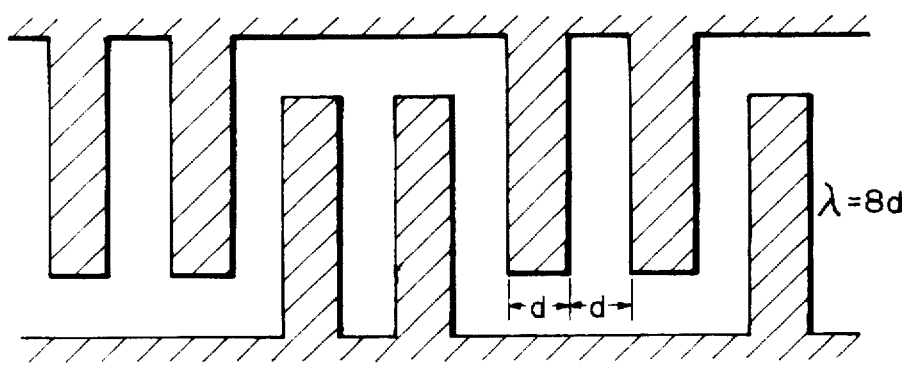
FIG. 5 is a schematic plan view showing another embodiment of the structure of an IDT which is usable in the SAW device according to the present invention.

The planar shape of the IDT is not particularly limited as long as it functions as such an electrode. Preferred examples of such an electrode may include a so-called "single-type electrode" as shown in the schematic plan view of FIG. 4, and a so-called "double-type electrode" as shown in the schematic plan view of FIG. 5.

Figure 6:
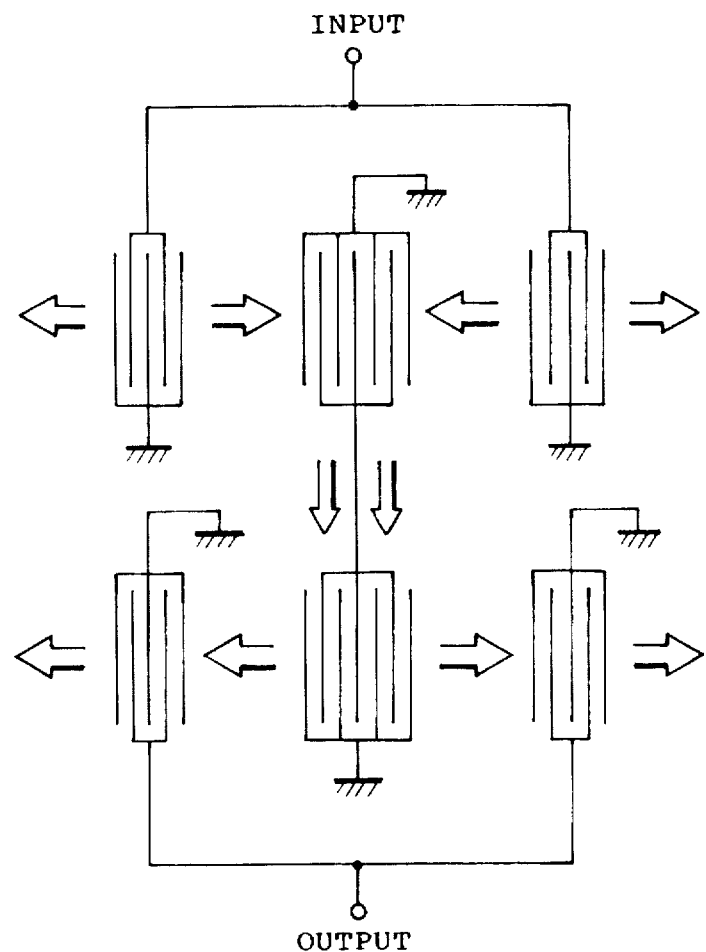
FIG. 6 is a schematic plan view showing a further embodiment of the structure (multi-electrode structure) of an IDT which is usable in the SAW device according to the present invention.
Figure 7:
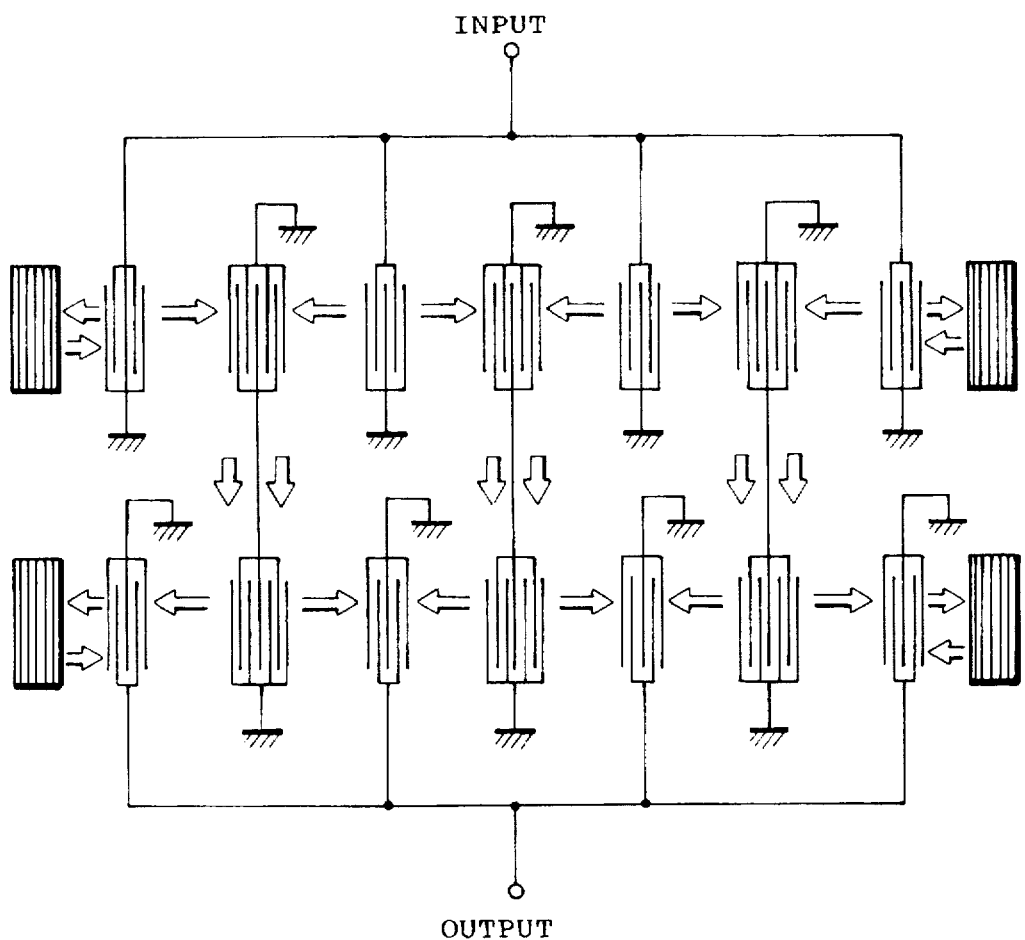
FIG. 7 is a schematic plan view showing a further embodiment of the structure (multi-electrode structure) of an IDT which is usable in the SAW device according to the present invention.
Figure 8:
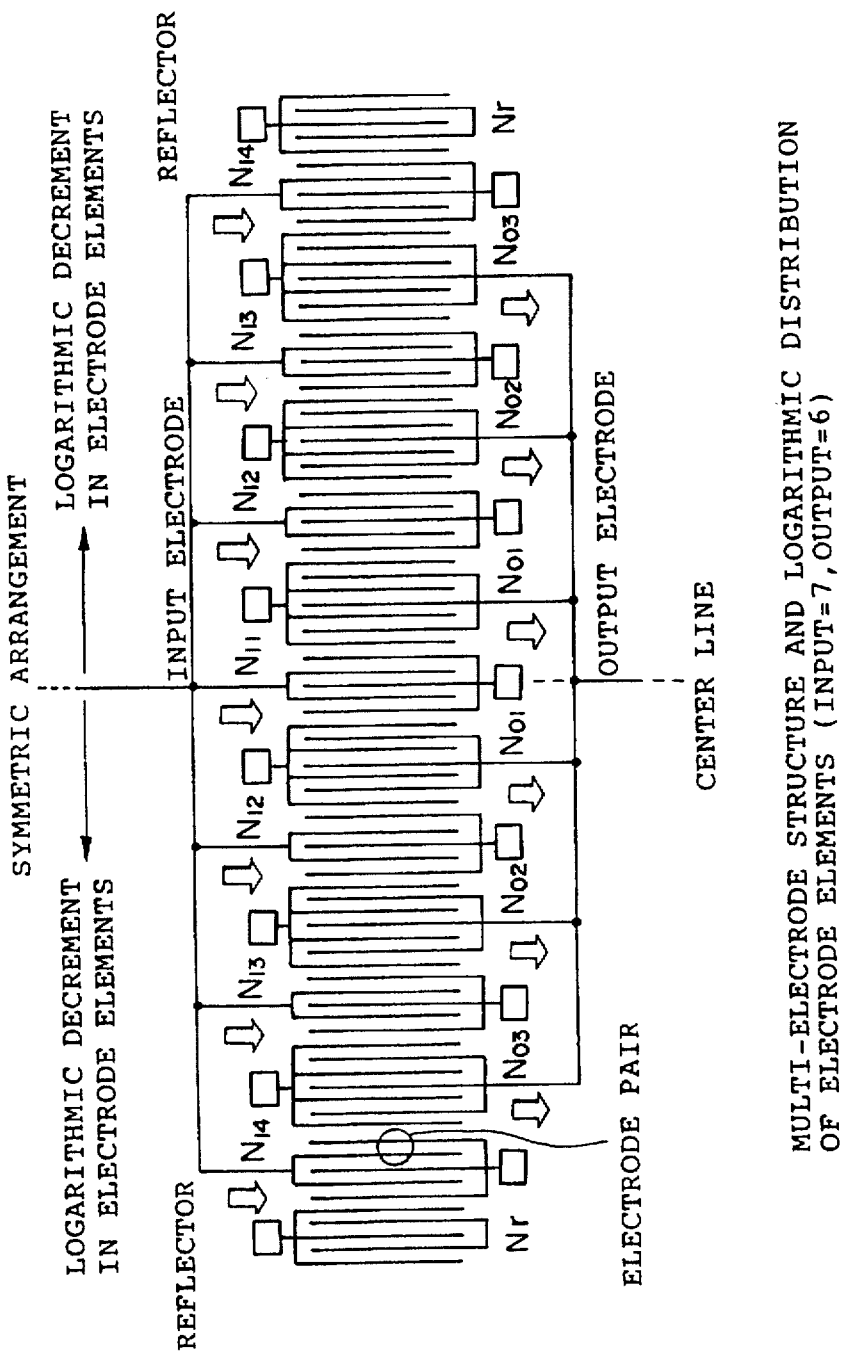
FIG. 8 is a schematic plan view showing a further embodiment of the structure (multi-electrode structure) of an IDT which is usable in the SAW device according to the present invention.

In the present invention, the above-described IDT may constitute a multi-electrode structure as shown in the schematic plan views of FIGS. 6 to 8. With respect to the details of such a multi-electrode structure, papers entitled "Densi Joho Tsushin Gakkai Gijutu Kenkyu Hokoku (Technical Research ReDort published by Electronics Information and Communication Society)", US-81, 25–31 pages (1990); and "FUJITSU" (Technical Bulletin), vol. 43(2), 179–185 pages (1992) may be referred to.

(Short-circuiting electrode)

In the SAW device according to the present invention, a short-circuiting electrode may further be disposed as desired. Such a short-circuiting electrode is an electrode which has a function of providing an equipotential state in an electric field so as to change the SAW (surface acoustic wave) characteristic of the SAW device. In general, the short-circuiting electrode (not shown) may be disposed on a surface of a piezoelectric substance layer 4 which is opposed to the other surface of the piezoelectric substance layer 4 on which an IDT 5 is disposed (i.e., the surface opposed to the IDT 5 through the medium of the piezoelectric substance layer 4; e.g., the upper surface of the piezoelectric substance layer 4 in the embodiment shown in FIG. 3).

The short-circuiting electrode may preferably comprise a (thin) film of a metal such as Al, Au, and Al—Cu. Since the short-circuiting electrode has a different function from that of the IDT, the material constituting the short-circuiting electrode is not necessarily the same as the material constituting the IDT.

The thickness of the short-circuiting electrode is not particularly limited as long as it functions as such an electrode. In general, the short-circuiting electrode may preferably have a thickness in the range of about 1–100 μm (more preferably, about 5–30 μm).

For example, the short-circuiting electrode may preferably have a planar shape of a "solid electrode" or "non-patterned electrode" which has the same occupation area as that of the IDT.

Hereinbelow, the present invention will be described in more detail with reference to specific Examples.

EXAMPLE 1

A 25 μm-thick high-resistivity polycrystalline diamond layer having a volume resistivity $10^7$ Ω·cm was formed on a low-resistivity silicon substrate having a volume resistivity of $10^{-1}$ Ω·cm, under the following conditions.

<Microwave plasma CVD method>

Microwave power: 500 W

Pressure: 40 Torr

Reactant gas: $CH_4/H_2$=3/100

Substrate temperature: 950° C.

A portion (i.e., a though hole having a diameter of 30 μm) through which grounding was to be effected, was formed in the above-described high-resistivity polycrystalline diamond layer by using a dry etching process and a metal (film) formation process, under the following conditions.

<Dry etching conditions>

Gas: $O_2/Ar$=1/100

Power: 500 W

Pressure: 70 Torr

<Metal formation conditions>

(First step)

Ti/Pt/Au sputtering (thickness: 5000 angstrom)

(Second step)

Au plating (thickness: 20 μm)

Then, on the resultant substrate having a high-resistivity diamond/Si structure in which the above through hole had been formed, an IDT comprising Al (thickness: 700 angstrom, planar shape: one as shown in FIG. 8) was formed by using a sputtering method as an ordinary Al film formation process. At the time of the formation of the above IDT, the electrical connection between a grounding part of the IDT and the above-described low-resistivity silicon substrate was achieved by the deposition of Al onto (or into) the above-described through hole.

On the resultant diamond substrate in which the grounding part of the IDT had been electrically connected to the low-resistivity silicon substrate as described above, a film of ZnO as a piezoelectric substance (thickness: 5000 angstrom) was formed by using a sputtering method thereby to fabricate a diamond surface acoustic wave device (SAW device) having a structure as shown in FIG. 9.

The thus obtained surface acoustic wave device had a multi-electrode structure, and the number of parts or points of the multi-electrode structure to be grounded was 15 (fifteen). Accordingly, the chip area of the resultant device was reduced to about ⅓ as compared with that of a chip which had been fabricated by using an ordinary wire bonding method, on the basis of the omission of bonding pad portions, etc.

EXAMPLE 2

On a silicon substrate, a 5 μm-thick low-resistivity polycrystalline diamond layer having a volume resistivity $10^{-2}$ Ω·cm was formed under the following conditions. Then, on the resultant low-resistivity polycrystalline diamond layer, a 20 μm-thick high-resistivity polycrystalline diamond layer having a volume resistivity $10^9$ Ω·cm was formed under the following conditions.

<Conditions for formation of low-resistivity polycrystalline diamond layer>

(Microwave plasma CVD method)
Microwave power: 500 W
Pressure: 40 Torr
Reactant gas: $CH_4/H_2=3/100$
$B_2H_6/CH_4=1000$ ppm
Substrate temperature: 950° C.

<Conditions for formation of high-resistivity polycrystalline diamond layer>

(Microwave plasma CVD method)
Microwave power: 500 W
Pressure: 40 Torr
Reactant gas: $CH_4/H_2=3/100$
Substrate temperature: 950° C.

A portion (i.e., a though hole having a diameter of 25 μm) through which grounding was to be effected, was formed in the above-described high-resistivity polycrystalline diamond layer by using a dry etching process and a metal (film) formation process under the following conditions.

<Dry etching conditions>

Gas: $O_2/Ar=1/100$
Power: 500 W
Pressure: 70 Torr

<Metal formation conditions>

(First step)

Al sputtering (thickness: 5000 angstrom)

(Second step)

Al plating (thickness: 20 μm)

Then, on the resultant substrate having a high-resistivity diamond/low-resistivity diamond/Si structure in which the above through hole had been formed, an IDT comprising Al (thickness: 700 angstrom, planar shape: one as shown in FIG.8) was formed by using a sputtering method as an ordinary Al film formation process. At the time of the formation of the above IDT, the electrical connection between a grounding part of the IDT and the above-described low-resistivity silicon substrate (or low-resistivity diamond layer) was achieved by the deposition of Al onto (or into) the above-described through hole.

On the resultant diamond substrate in which the grounding part of the IDT had been electrically connected to the low-resistivity silicon substrate (or low-resistivity diamond layer) as described above, a film of ZnO as a piezoelectric substance (thickness: 5000 angstrom) was formed by using a sputtering method thereby to fabricate a diamond surface acoustic wave device (SAW device) having a structure as shown in FIG.3.

The thus obtained surface acoustic wave device had a multi-electrode structure, and the number of parts or points of the multi-electrode structure to be grounded was 15 (fifteen). Accordingly, the chip area of the resultant device was reduced to about ⅔as compared with that of a chip which had been fabricated by using an ordinary wire bonding method, on the basis of the omission of bonding pad portions, etc.

As described hereinabove, according to the present invention, there is provided a diamond base material for surface acoustic wave device, which comprises: a low-resistivity member (a low-resistivity base material, low-resistivity diamond layer, etc.), and a high-resistivity diamond layer disposed on the low-resistivity member.

The present invention also provides a SAW device comprising the above-mentioned base material as a component, wherein a through hole has been formed in the above high-resistivity diamond layer for the purpose of grounding According to the present invention, at least a portion of bonding pads for wire bonding which have heretofore been used at the time of device mounting may be omitted, and therefore the size of the resultant device may be reduced. In the case of a device having a multi-electrode structure, the effect of reducing the size of the device per se becomes particularly marked.

In addition, the condition or requirement for the selection of a grounding position or location may be relaxed or relieved, and therefore the degree of freedom or latitude in device design may be increased. As a result, the size of a device may also be reduced from such a viewpoint.

In addition, according to the present invention, the number of the wire bonding steps may be minimized (e.g., it may be sufficient to conduct the wire bonding step only for a signal line for minimum requirement). Therefore, the wire bonding steps itself may also be simplified.

As a result, the present invention may remarkably facilitate the fabrication or manufacturing of a small-sized device of a surface-mounting type, on the basis of a feature, or a combination of features as described above.

The basic Japanese Application No. 137628/1994 filed on Jun. 20, 1994 (i.e., Hei 6-137628) is hereby incorporated by reference.

Many modifications of the present invention may be made without departing from the essential scope thereof. It should be understood that the present invention is not limited to the specific embodiments as described.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A diamond base material for surface acoustic wave device, comprising: a low-resistivity base material, and a high-resistivity diamond layer having a thickness of 5–50 μm disposed on the low-resistivity base material.

2. A diamond base material for surface acoustic wave device according to claim 1, wherein the ratio of the resistivities between the high-resistivity diamond layer and the low-resistivity base material is not less than $10^3$.

3. A diamond base material for surface acoustic wave device, comprising: a base material, a low-resistivity diamond layer having a thickness of 0.3–10 μm disposed on the base material, and a high-resistivity diamond layer having a thickness of 5–50 μm disposed on the low-resistivity diamond layer.

4. A diamond base material for surface acoustic wave device according to claim 3, wherein the ratio of the resistivities between the high-resistivity diamond layer and the low-resistivity diamond layer is not less than $10^3$.

* * * * *